(12) United States Patent
Lai et al.

(10) Patent No.: US 9,773,860 B1
(45) Date of Patent: Sep. 26, 2017

(54) CAPACITOR AND METHOD FOR FABRICATING THE SAME

(71) Applicant: UNITED MICROELECTRONICS CORP., Hsin-Chu (TW)

(72) Inventors: Yu-Tsung Lai, Tainan (TW); Ching-Li Yang, Ping-Tung Hsien (TW); Yu-Cheng Tung, Kaohsiung (TW); Shih-Che Huang, Chiayi (TW); Chih-Sheng Chang, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/257,930

(22) Filed: Sep. 7, 2016

(30) Foreign Application Priority Data

Aug. 8, 2016 (TW) .............................. 105125109 A

(51) Int. Cl.
*H01L 49/02* (2006.01)
(52) U.S. Cl.
CPC .................................. *H01L 28/60* (2013.01)
(58) Field of Classification Search
CPC ... H01L 28/60; H01L 28/40; H01L 27/10852; H01L 23/5223; H01L 27/0805
See application file for complete search history.

(56) References Cited

U.S. PATENT DOCUMENTS

| | | | |
|---|---|---|---|
| 6,144,051 A | 11/2000 | Nishimura et al. | |
| 7,229,875 B2 * | 6/2007 | Lee | H01L 28/40 257/E21.008 |
| 8,952,491 B2 * | 2/2015 | Kurachi | H01L 29/92 257/532 |
| 9,257,497 B2 | 2/2016 | Chang et al. | |
| 9,368,392 B2 * | 6/2016 | Tseng | H01L 23/481 |
| 2002/0074588 A1 * | 6/2002 | Lee | H01L 28/55 257/306 |
| 2002/0179951 A1 | 12/2002 | Yoshiyama et al. | |
| 2009/0140262 A1 * | 6/2009 | Ohki | H01L 23/291 257/76 |
| 2010/0270643 A1 | 10/2010 | Iwaki | |
| 2013/0049109 A1 * | 2/2013 | Lim | H01L 21/823456 257/334 |
| 2014/0239289 A1 * | 8/2014 | Morooka | H01L 29/7869 257/43 |
| 2015/0349254 A1 | 12/2015 | Chang et al. | |
| 2016/0020390 A1 * | 1/2016 | Chang | H01L 45/1253 257/4 |

* cited by examiner

*Primary Examiner* — Phuc Dang
(74) *Attorney, Agent, or Firm* — Winston Hsu

(57) ABSTRACT

A method for fabricating a capacitor is disclosed. First, a substrate is provided, a bottom electrode and a capacitor dielectric layer are formed on the substrate, a conductive layer is formed on the capacitor dielectric layer, a patterned hard mask is formed on the conductive layer, a patterned hard mask is used to remove part of the conductive layer to form a top electrode, the patterned hard mask is removed, and a protective layer is formed on a top surface and sidewalls of top electrode. Preferably, the protective layer includes metal oxides.

16 Claims, 3 Drawing Sheets

CAPACITOR AND METHOD FOR FABRICATING THE SAME

BACKGROUND OF THE INVENTION

1. Field of the Invention

The invention relates to a capacitor and fabrication method thereof, and more particularly to a metal-insulator-metal (MIM) capacitor and fabrication method thereof.

2. Description of the Prior Art

In semiconductor manufacturing processes, metal capacitors formed of metal-insulator-metal (MIM) are widely used in the design of ultra large scale integrations (ULSI). Because a MIM capacitor has low resistance and low parasitic capacitance, and has no problems in shifts of depletion induced voltage, MIM capacitors have become the main structure used for metal capacitors. It is therefore important to develop a MIM capacitor that comprises copper electrodes with low resistance.

With the increasing complexity of integrated circuits, the multilevel interconnect process has become the typical method used in semiconductor integrated circuit fabrication. To satisfy the requirements for high integration and high speed in integrated circuits (ICs), especially in a deep sub-micro (<0.18 μm) semiconductor process, a copper (Cu) dual damascene process is becoming more widely used as a standard process in forming an interconnection line within the inter-metal dielectric layer of low dielectric constant (low k) materials. Since copper has both a low resistance and a low electromigration resistance, the low k materials are useful in improving the RC delay effect of a metal interconnection. Consequently, how to integrate copper fabrication processes to fabricate MIM capacitors and internal metal wires with low resistance has become a key research topic in this field.

SUMMARY OF THE INVENTION

According to a preferred embodiment of the present invention, a method for fabricating a capacitor is disclosed. First, a substrate is provided, a bottom electrode and a capacitor dielectric layer are formed on the substrate, a conductive layer is formed on the capacitor dielectric layer, a patterned hard mask is formed on the conductive layer, a patterned hard mask is used to remove part of the conductive layer to form a top electrode, the patterned hard mask is removed, and a protective layer is formed on a top surface and sidewalls of top electrode. Preferably, the protective layer includes metal oxides.

According to another aspect of the present invention, a capacitor is disclosed. The capacitor includes: a bottom electrode on a substrate; a capacitor dielectric layer on the bottom electrode; a top electrode on the capacitor dielectric layer; and a protective layer on a top surface and sidewalls of the top electrode. Preferably, the protective layer comprises a metal oxide.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
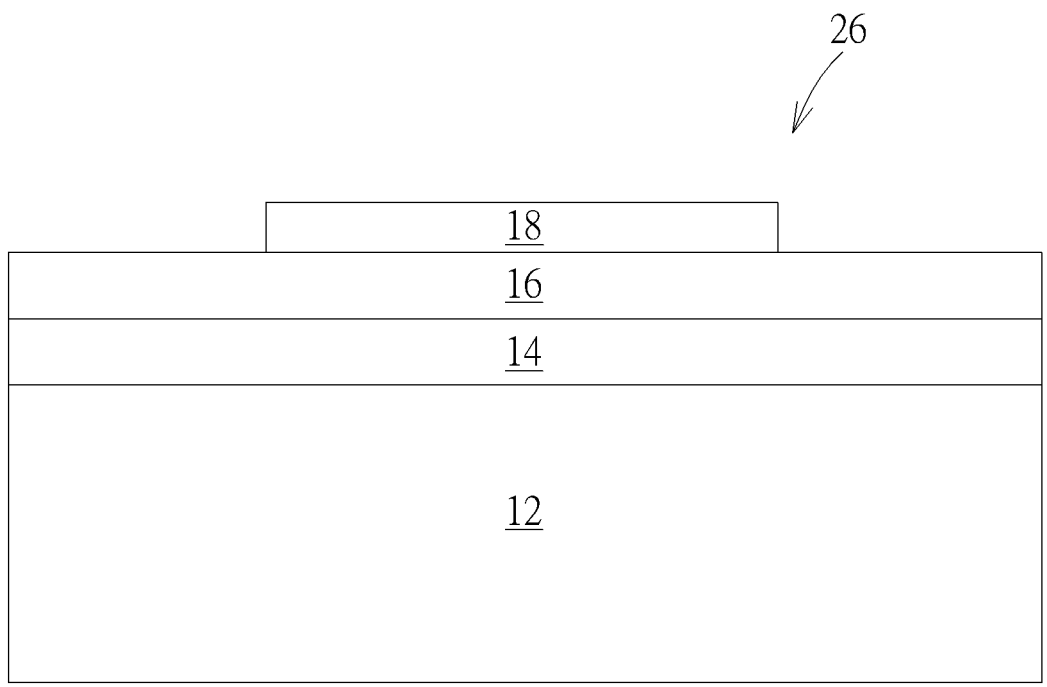
FIGS. 1-4 illustrate a method for fabricating a MIM capacitor according to a preferred embodiment of the present invention.

Referring to FIGS. 1-4, FIGS. 1-4 illustrate a method for fabricating a MIM capacitor according to a preferred embodiment of the present invention. As shown in FIG. 1, a substrate 12, such as a semiconductor substrate including silicon substrate, epitaxial silicon substrate, silicon carbide (SiC) substrate, or silicon-on-insulator (SOI) substrate is provided. At least an active device could be disposed on the substrate 12, in which the active device could include metal-oxide semiconductor (MOS) transistor, oxide semiconductor field effect transistor (OS FET), fin field effect transistor (FinFET), or other active devices. If a MOS transistor were to be fabricated, the MOS transistor could include elements such as a gate structure on the substrate, a spacer adjacent to the sidewalls of the gate structure, and a source/drain region in the substrate adjacent to two sides of the spacer.

More specifically, the gate structure could be a polysilicon gate made of polysilicon or a metal gate. If a metal gate were to be fabricated, it would further include elements such as a high-k dielectric layer, a work function metal layer, and a low resistance metal layer. Preferably, the high-k dielectric layer is selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

The work function metal layer is formed for tuning the work function of the later formed metal gates to be adaptable in an NMOS or a PMOS. For an NMOS transistor, the work function metal layer having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer and the low resistance metal layer, in which the material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof.

Next, an interlayer dielectric (ILD) layer (not shown) is formed on the substrate 12 to cover the MOS transistor or other active devices, and a capacitor 26 is formed on the substrate 12. Preferably, the capacitor 26 includes a bottom electrode, a capacitor dielectric layer, and a top electrode.

In this embodiment, the formation of the capacitor 26 could be accomplished by sequentially forming a first conductive layer 14, a dielectric layer 16, and a second conductive layer (not shown) on the substrate 12, and then conducting a pattern transfer process on the second conductive layer. For instance, an etching process could be conducted to remove part of the second conductive layer to form a patterned second conductive layer. Preferably, the un-patterned first conductive layer later becomes a bottom electrode of the capacitor 26, the un-patterned dielectric layer later becomes a capacitor dielectric layer, and the patterned second conductive layer becomes atop electrode 18. In this embodiment, the top electrode 18 preferably includes W, Ti, TiN, Ta, TaN, Al, or combination thereof, but not limited thereto.

Figure 2:
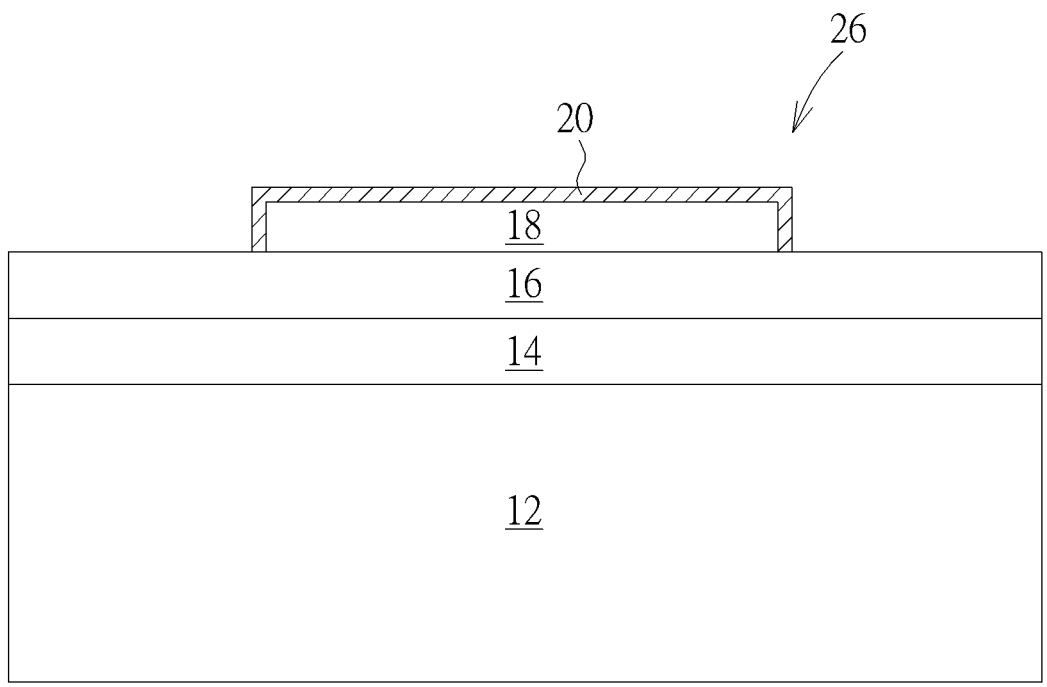

Next, as shown in FIG. 2, a treatment process is conducted to expose the top electrode 18 to an oxygen-containing gas for forming a protective layer 20 on the top surface and sidewalls of the top electrode 18. In this embodiment, the oxygen-containing gas preferably includes $N_2O$, but not limited thereto. The protective layer 20 preferably includes a metal oxide, which could be selected from the group consisting of $TiO_x$, TiON, $TaO_x$, and TaON. It should be noted that since no hard mask or blocking layer is disposed on the top surface of the top electrode 18 and the oxygen-containing gas from the treatment process conducted in this embodiment only reacts with metal, the protective layer 20 would only be formed on the exposed top surface and sidewalls of the top electrode 18 but not on the top surface of the dielectric layer 16.

Figure 3:
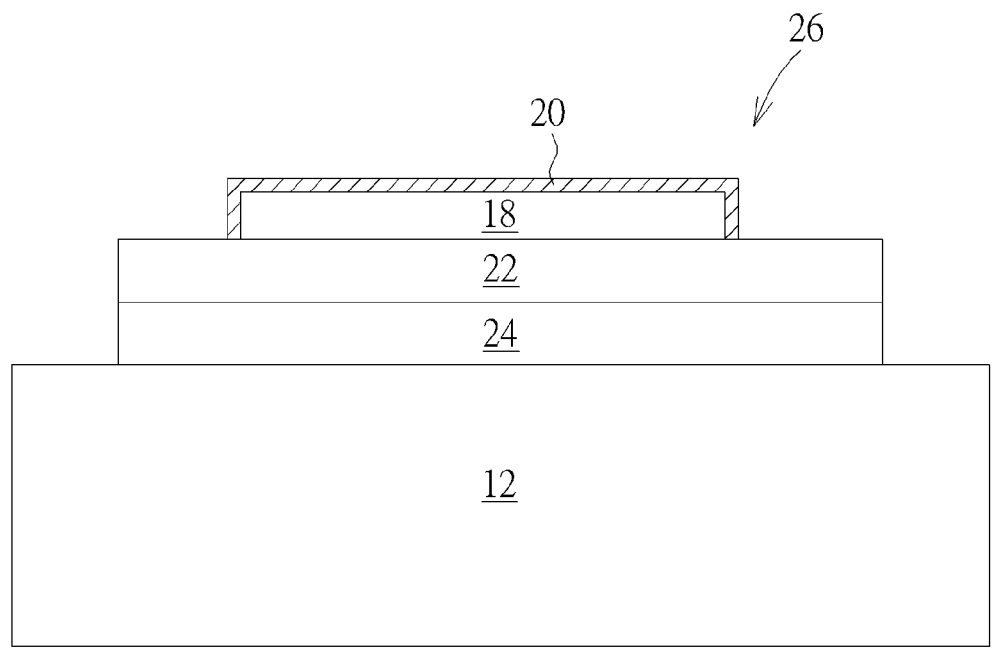

Next, as shown in FIG. 3, another pattern transfer process is conducted on the dielectric layer 16 and first conductive layer 14. For instance, it would be desirable to first form a patterned mask (not shown) or blocking layer on the dielectric layer 16, and an etching process is conducted to remove part of the dielectric layer 16 and part of the first conductive layer 14 to form a capacitor dielectric layer 22 and bottom electrode 24. The patterned mask is then removed thereafter. In this embodiment, a width of the top electrode 18 is slightly less than the widths of the capacitor dielectric layer 22 and bottom electrode 24 after the pattern transfer process. The thickness of the protective layer 20 on the top surface of the top electrode 18 could also be greater than, equal to, or even less than the thickness of the protective layer 20 on a sidewall of the top electrode 18, which are all within the scope of the present invention.

According to a preferred embodiment of the present invention, the top electrode 18 and bottom electrode 24 of the capacitor 26 could be made of same material or different material, and could all be selected from the group consisting of W, Ti, TiN, Ta, TaN, and Al. The capacitor dielectric layer 22 is preferably made of dielectric material with low leakage, such as a dielectric selected from the group consisting of oxide-nitride-oxide (ONO), silicon nitride, silicon oxide, and silicon oxynitride.

Moreover, according to an embodiment of the present invention, the capacitor dielectric layer 22 could also include a high-k dielectric layer selected from dielectric materials having dielectric constant (k value) larger than 4, in which the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Figure 4:
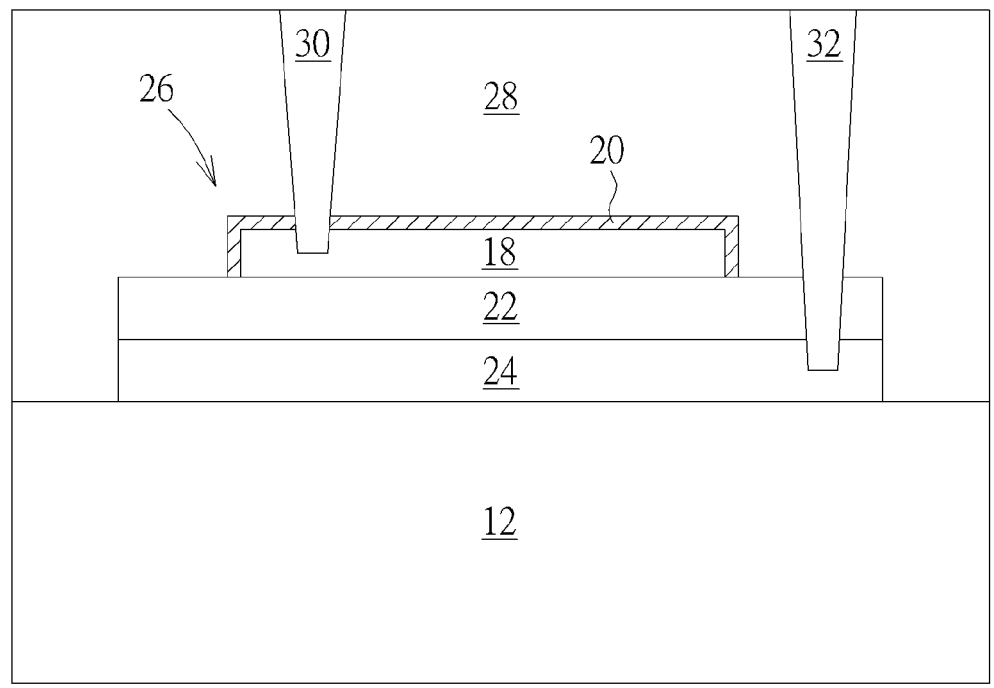

Next, as shown in FIG. 4, a dielectric layer 28 is formed on the substrate 12 to cover the capacitor 26 completely, and contact plugs 30, 32 are formed in the dielectric layer 28 to electrically connect the top electrode 18 and bottom electrode 24 respectively. The formation of the contact plugs 30, 32 could be accomplished by first performing a photo-etching process to remove part of the dielectric layer 28 and part of the capacitor dielectric layer 22 to form contact holes (not shown) exposing part of the top electrode 18 and part of the bottom electrode 24. Next, a barrier layer (not shown) and a metal layer (not shown) are formed into the contact holes, and a planarizing process such as chemical mechanical polishing (CMP) process is conducted to remove part of the metal layer and part of the barrier layer to form contact plugs 30, 32. Preferably, the barrier layer could be selected from the group consisting of Ti, TiN, Ta, and TaN and the metal layer could be selected from the group consisting of W, Cu, Al, TiAl, and CoWP. This completes the fabrication of a semiconductor device according to a preferred embodiment of the present invention.

Figure 5:
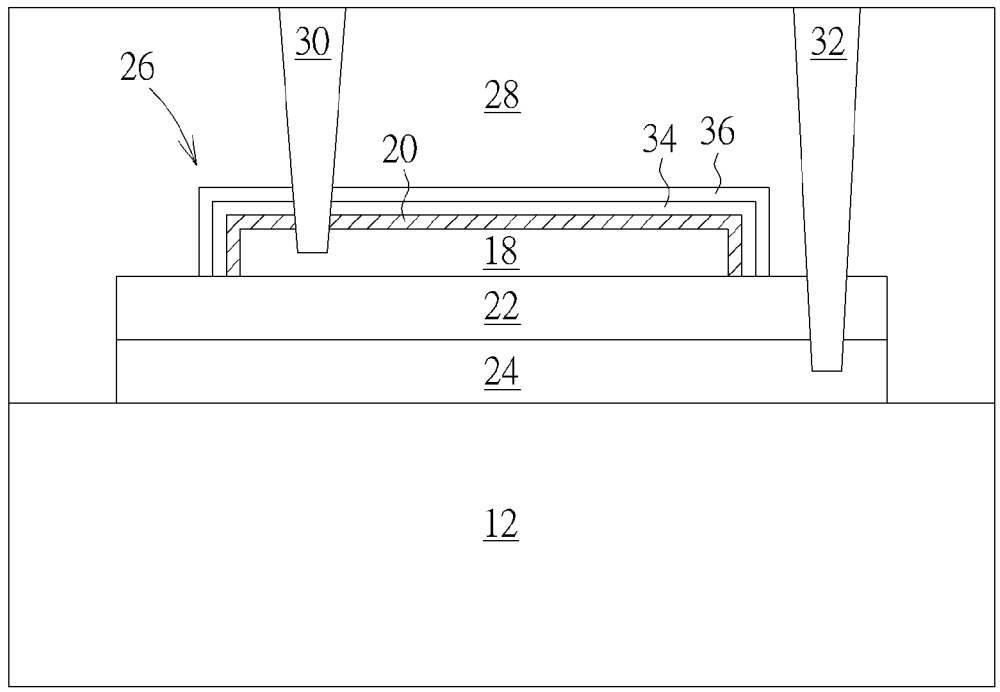
FIG. 5 illustrates a structural view of a semiconductor device according to an embodiment of the present invention.

Referring to FIG. 5, FIG. 5 illustrates a structural view of a semiconductor device according to an embodiment of the present invention. As shown in FIG. 5, it would also be desirable to form a first cap layer 34 and a second cap layer 36 on the substrate 12 and protective layer 20 after the protective layer 20 is formed, and a dielectric layer 28 is formed on the second cap layer 36, and finally contact plugs 30, 32 are formed within the dielectric layer 28, second cap layer 36, first cap layer 34, and capacitor dielectric layer 22 to electrically connect the top electrode 18 and bottom electrode 24. In this embodiment, the first cap layer 34 is preferably deposited as a buffer layer while the second cap layer 36 could be serving as an etch stop layer. The first cap layer 34 and second cap layer 36 could also be made of same material or different material, while the two cap layers 34, 36 could all be selected from the group consisting of SiN, SiON, and SiCN.

Figure 6:
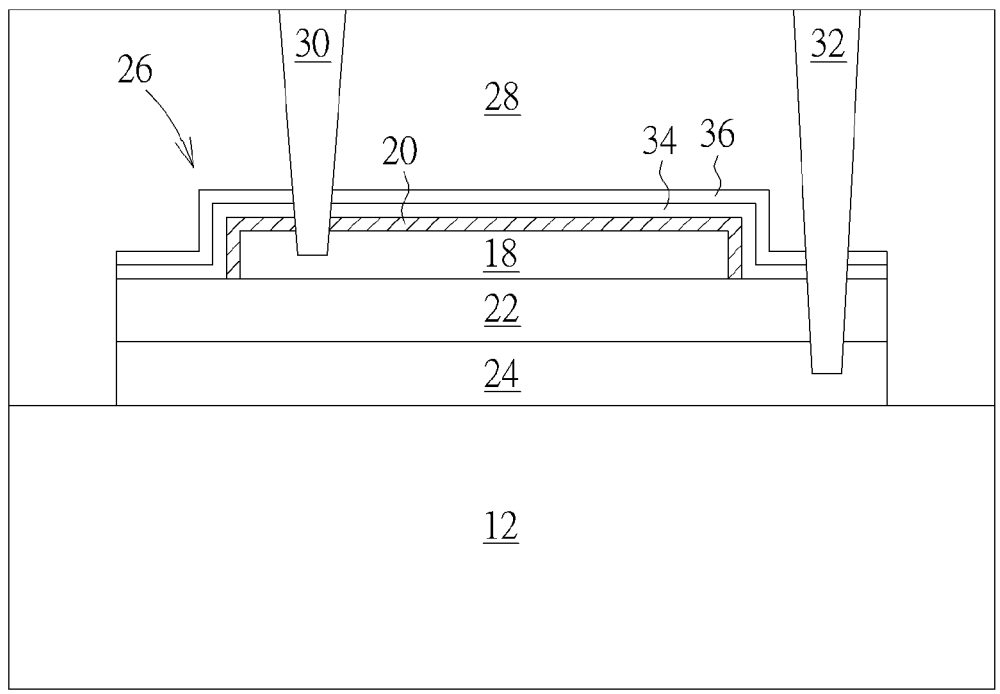
FIG. 6 illustrates a structural view of a semiconductor device according to an embodiment of the present invention.

Referring to FIG. 6, FIG. 6 illustrates a structural view of a semiconductor device according to an embodiment of the present invention. As shown in FIG. 6, it would be desirable to form a first cap layer 34 and second cap layer 36 on the dielectric layer 16 after forming the protective layer 20 in FIG. 2 but before patterning the first conductive layer 14 and dielectric layer 16, and then forming a patterned mask (not shown) on the dielectric layer 16, and using an etching process to remove part of the second cap layer 36, part of the first cap layer 34, part of the dielectric layer 16, and part of the first conductive layer 14 to form patterned second cap layer 36, patterned first cap layer 34, capacitor dielectric layer 22, and bottom electrode 24 at the same time. The patterned mask is then removed thereafter. Since the second cap layer 36 and first cap layer 34 are etched at the same time with the dielectric layer 16 and first conductive layer 14, the edges of the second cap layer 36 and first cap layer 34 are aligned with edges of the capacitor dielectric layer 22 and bottom electrode 24.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a capacitor, comprising:
   providing a substrate;
   forming a capacitor on the substrate, wherein the capacitor comprises a bottom electrode, a capacitor dielectric layer, and a top electrode; and
   forming a protective layer on a top surface and sidewalls of the top electrode, wherein the protective layer comprises a metal oxide and the protective layer is reverse U-shaped.

2. The method of claim 1, further comprising performing a treatment process to form the protective layer.

3. The method of claim 2, wherein the treatment process comprises exposing the top surface and the sidewalls of the top electrode to an oxygen-containing gas.

4. The method of claim 2, further comprising:
   forming a first cap layer on the capacitor dielectric layer and the protective layer;
   forming a dielectric layer on the first cap layer;
   forming a first contact plug in the dielectric layer to electrically connect the top electrode; and
   forming a second contact plug in the dielectric layer and the capacitor dielectric layer to electrically connect the bottom electrode.

5. The method of claim 4, further comprising forming a second cap layer on the first cap layer before forming the dielectric layer.

6. The method of claim 1, wherein the protective layer is selected from the group consisting of $TiO_x$, TiON, $TaO_x$, and TaON.

7. A capacitor, comprising:
   a bottom electrode on a substrate;
   a capacitor dielectric layer on the bottom electrode;
   a top electrode on the capacitor dielectric layer; and
   a protective layer on a top surface and sidewalls of the top electrode, wherein the protective layer comprises a metal oxide and the protective layer is reverse U-shaped.

8. The semiconductor device of claim 7, further comprising:
   a first cap layer on the capacitor dielectric layer and the protective layer;
   a dielectric layer on the first cap layer;
   a first contact plug in the dielectric layer to electrically connect the top electrode; and
   a second contact plug in the dielectric layer and the capacitor dielectric layer to electrically connect to the bottom electrode.

9. The semiconductor device of claim 8, further comprising a second cap layer between the first cap layer and the dielectric layer.

10. The semiconductor device of claim 7, wherein the protective layer is selected from the group consisting of $TiO_x$, TiON, $TaO_x$, and TaON.

11. The semiconductor device of claim 7, wherein a thickness of the protective layer on the top surface of the top electrode is greater than a thickness of the protective layer on the sidewalls of the top electrode.

12. A capacitor, comprising:
    a bottom electrode on a substrate;
    a capacitor dielectric layer on the bottom electrode;
    a top electrode on the capacitor dielectric layer; and
    a protective layer on a top surface and sidewalls of the top electrode without contacting the bottom electrode, wherein the protective layer comprises a metal oxide.

13. The semiconductor device of claim 12, further comprising:
    a first cap layer on the capacitor dielectric layer and the protective layer;
    a dielectric layer on the first cap layer;
    a first contact plug in the dielectric layer to electrically connect the top electrode; and
    a second contact plug in the dielectric layer and the capacitor dielectric layer to electrically connect to the bottom electrode.

14. The semiconductor device of claim 13, further comprising a second cap layer between the first cap layer and the dielectric layer.

15. The semiconductor device of claim 12, wherein the protective layer is selected from the group consisting of $TiO_x$, TiON, $TaO_x$, and TaON.

16. The semiconductor device of claim 12, wherein a thickness of the protective layer on the top surface of the top electrode is greater than a thickness of the protective layer on the sidewalls of the top electrode.

* * * * *